United States Patent
Du

(12) 
(10) Patent No.: US 6,268,730 B1
(45) Date of Patent: Jul. 31, 2001

(54) MULTI-SLAB MULTI-WINDOW CARDIAC MR IMAGING

(75) Inventor: Yiping Du, Towson, MD (US)

(73) Assignee: GE Medical Systems Global Technology Company LLC, Waukesha, WI (US)

(*) Notice: Subject to any disclaimer, the term of this patent is extended or adjusted under 35 U.S.C. 154(b) by 0 days.

(21) Appl. No.: 09/317,510

(22) Filed: May 24, 1999

(51) Int. Cl.[7] .................................................. G01V 3/00
(52) U.S. Cl. ............................................................ 324/309
(58) Field of Search ....................................... 324/309, 307

(56) References Cited

U.S. PATENT DOCUMENTS

| | | |
|---|---|---|
| Re. 35,656 * 11/1997 | Feinberg et al. | 324/309 |
| 4,663,591 5/1987 | Pelc et al. | 324/309 |
| 4,994,473 2/1991 | Broadhurst | 514/335 |
| 5,167,232 12/1992 | Parker et al. | 128/653.3 |
| 5,200,700 4/1993 | Glover et al. | 324/309 |
| 5,251,628 * 10/1993 | Foo . | |
| 5,363,844 11/1994 | Riederer et al. | 128/653.2 |
| 5,613,492 * 3/1997 | Feinberg | 324/307 |

* cited by examiner

Primary Examiner—Christine Oda
Assistant Examiner—Dixomara Vargas
(74) Attorney, Agent, or Firm—Quarles & Brady, LLP; Christian G. Cabou

(57) ABSTRACT

An MRI system acquired NMR data from which a three-dimensional image of a patient's heart is reconstructed. The NMR data is acquired as a plurality of three-dimensional slabs that are concatenated to reconstruct the image. A plurality of respiratory gating windows are established and NMR data for each slab is acquired during a different one of the respiratory gating windows.

10 Claims, 3 Drawing Sheets

MULTI-SLAB MULTI-WINDOW CARDIAC MR IMAGING

BACKGROUND OF THE INVENTION

The field of the invention is nuclear magnetic resonance imaging methods and systems. More particularly, the invention relates to the correction of MRI data acquired during patient motion.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a time varying magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins which may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The present invention will be described in detail with reference to a variant of the well known Fourier transform (FT) imaging technique, which is frequently referred to as "spin-warp". The spin-warp technique is discussed in an article entitled "Spin-Warp NMR Imaging and Applications to Human Whole-Body Imaging" by W. A. Edelstein et al., *Physics in Medicine and Biology*, Vol. 25, pp. 751–756 (1980). It employs a variable amplitude phase encoding magnetic field gradient pulse prior to the acquisition of NMR signals to phase encode spatial information in the direction of this gradient. In a two-dimensional implementation (2DFT), for example, spatial information is encoded in one direction by applying a phase encoding gradient ($G_y$) along that direction, and then a signal is acquired in the presence of a readout magnetic field gradient ($G_x$) in a direction orthogonal to the phase encoding direction. The readout gradient present during the acquisition encodes spatial information in the orthogonal direction. In a typical 2DFT pulse sequence, the magnitude of the phase encoding gradient pulse $G_y$ is incremented ($\Delta G_y$) in the sequence of "views" that are acquired during the scan to produce a set of NMR data from which an entire image can be reconstructed.

Most NMR scans currently used to produce high resolution 3D medical images, such as the image of coronary arteries, can require a few minutes to acquire the necessary data. Because of the long scan time, patient movement during the scan may be significant and can corrupt the reconstructed image with motion artifacts. There are also many types of patient motion such as respiratory motion, cardiac motion, blood flow, and peristalsis. There are many methods used to reduce or eliminate such motion artifacts including methods for reducing the motion (e.g. breath holding), methods for reducing the effects of motion (e.g. U.S. Pat. No. 4,663,591), and methods for correcting the acquired data for known motion (e.g. U.S. Pat. No. 5,200,700). In the case of respiratory motion, one of the best known methods for reducing motion artifacts is to gate the acquisition of data such that the views are acquired only during a preset portion, or "acquisition window" of the respiratory cycle.

Prior respiratory gating methods employ a means for sensing patient respiration (e.g. U.S. Pat. No. 4,994,473) and producing a gating signal for the MRI system during a preset portion of the respiratory cycle. As long as the gating signal is produced, the MRI system acquires NMR data in the prescribed view order. During other parts of the respiratory cycle the gating signal is turned off and no data is acquired. As a result, when respiratory gating is used the scan time is increased significantly because data can only be acquired over a relatively small portion of each respiratory cycle.

Rather than acquiring NMR data over a relatively short acquisition time, methods are known for acquiring NMR data during subject motion and correcting the data. Such methods often employ a navigator pulse sequence which is interleaved with the acquisition of NMR image data and which is designed to measure subject position. For example, a navigator pulse sequence is disclosed in U.S. Pat. No. 5,363,844 for measuring the position of a patients diaphragm throughout image data acquisition. This position information may be used as described by T. S. Sachs, et al., "Real-Time Motion Detection in Spiral MRI Using Navigators", *Magn. Reson. in Med.*, 32:639–645 (1994) to reject image data acquired during portions of the respiratory or cardiac cycle which produce unacceptable image artifacts. The position information from a navigator echo signal may also be used prospectively as described by M. V. McConnell, *"Prospectively Adaptive Navigator Correction for Breath-hold MR Coronary Angiography"*, *Magn. Reson. in Med.*, 37:148–152 (1997) to adjust the reference phase of the MRI system receiver to correct the subsequently acquired NMR image data. Or, the navigator signal position information may be used to retroactively correct the phase of acquired k-space image data as described by M. E. Brummer, et al., *"Reduction Of Respiratory Motion Artifacts In Coronary MRA Using Navigator Echoes"*, Proc. International Society of Magnetic Resonance in Medicine, 748 (1995).

When acquiring three-dimensional images of moving subjects, such as coronary arteries, it is desirable to acquire the 3D NMR data set from the three-dimensional region of interest by sequentially exciting a series of thin slabs and concatenating the NMR data acquired from the slabs. As described in U.S. Pat. No. 5,167,232 entitled "Magnetic Resonance Angiography By Sequential Multiple Thin Slab Three-Dimensional Acquisition", the thin slabs are overlapped to prevent signal loss at the boundaries due to imperfect slab excitation profiles. When respiratory gating is used, a single respiratory gating window is established and all the data for each slab is acquired during the gating window. The data acquisition for the next slab does not start until the data acquisition for the current slab is completed. This can require a lengthy scan time.

SUMMARY OF THE INVENTION

The present invention is a method and system for acquiring multi-slab 3D MRI data from a region of interest using respiratory gating. More particularly, a pilot scan is conducted in which a plurality of respiratory gating windows are established and a corresponding plurality of slabs are prescribed. A scan is then conducted in which 3D MRI data is acquired during each of the plurality of respiratory gating windows for corresponding ones of the plurality of slabs. The 3D MRI data acquired for each slab is combined to form a single 3D MRI data set depicting the region of interest.

MRI data is acquired over a greater portion of each respiratory cycle thus enabling the entire 3D MRI data set to be acquired in a shorter scan time.

DESCRIPTION OF THE PREFERRED EMBODIMENT

Figure 1:
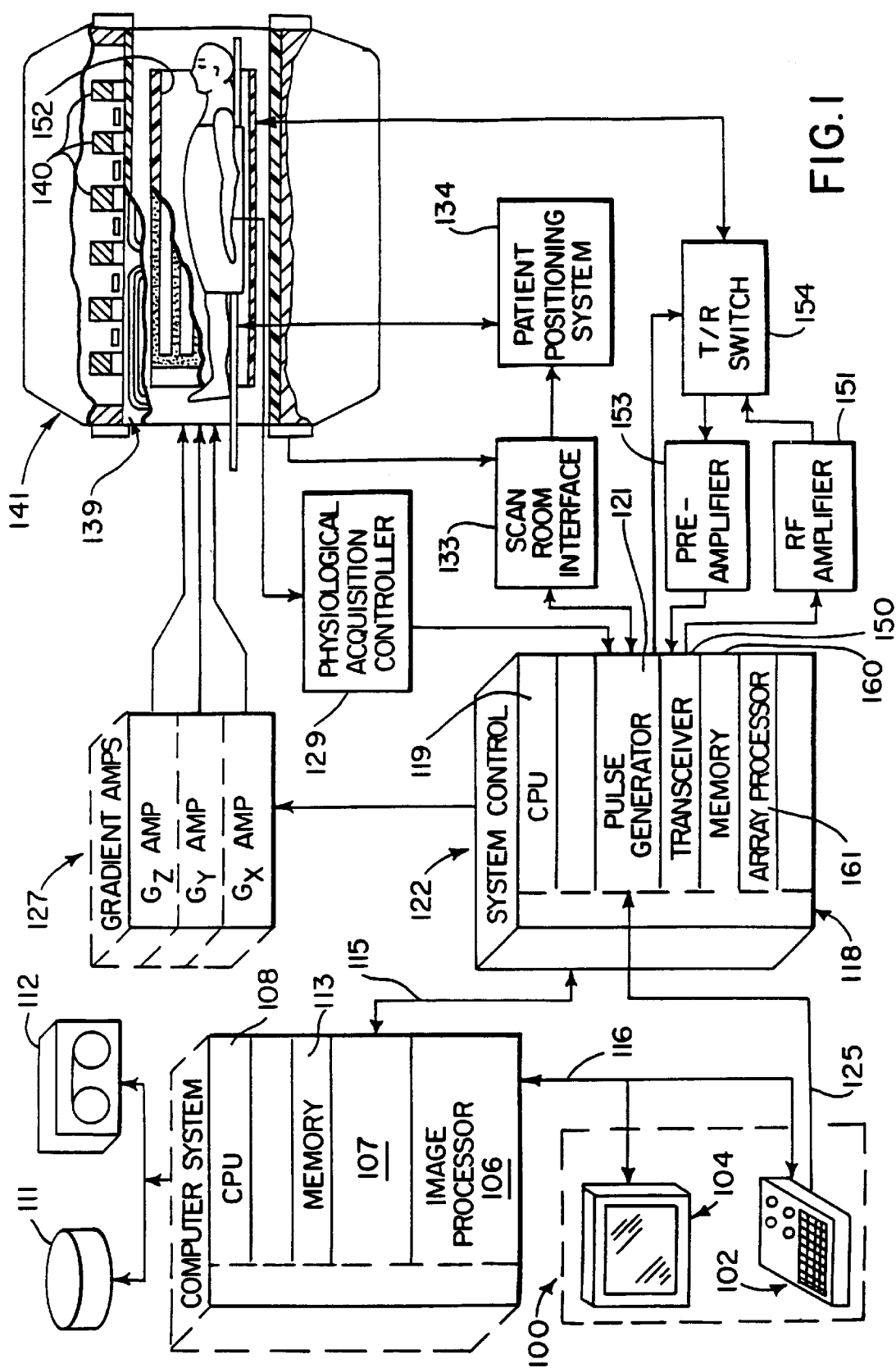
FIG. 1 is a block diagram of an MRI system which has been modified as taught by the present application to employ the preferred embodiment of the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 166 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane 118. These include a CPU module 119 and a pulse generator module 121 which connects to the operator console 100 through a serial link 125. It is through this link 125 that the system control 122 receives commands from the operator which indicate the scan sequence that is to be performed.

The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from sensors connected to the patient. One such signal is an ECG signal which is processed by the controller 129 to produce a cardiac trigger signal for the pulse generator module 121. The pulse generator module 121 also connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmissive receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmiv/receive switch 154 also enables a separate RF coil (for example, a head coil or surface coil) to be used in either the transmit or receive mode.

The NMR signals picked up by the RF coil 152 are down converted by an RF reference signal and then digitized by the transceiver module 150. The digitized NMR signal is transferred to a memory module 160 in the system control 122. When the scan is completed and an entire array of k-space NMR data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104. For a more detailed description of the transceiver 150, reference is made to U.S. Pat. Nos. 4,952,877 and 4,992,736.

Figure 2:
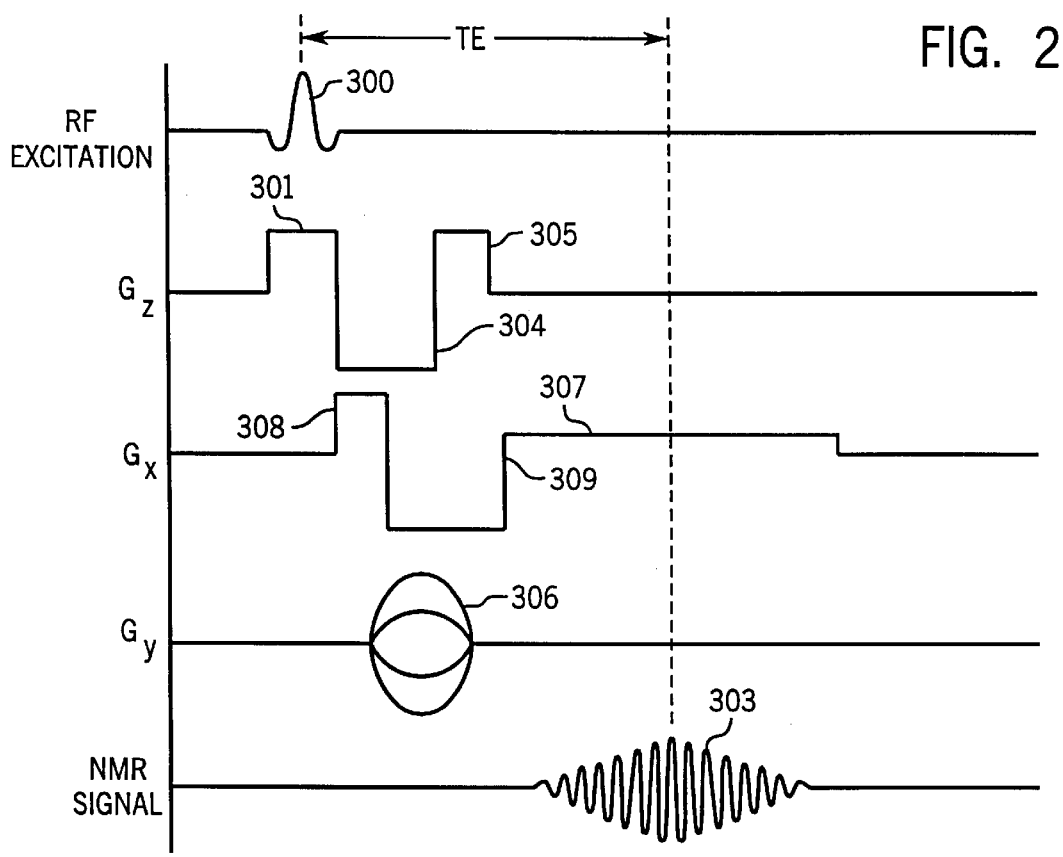
FIG. 2 is an exemplary 3D NMR imaging pulse sequence which may be used when practicing the present invention.

The MRI system of FIG. 1 performs a series of pulse sequences to collect sufficient NMR data to reconstruct the desired image. Referring particularly to FIG. 2, an exemplary 3D gradient recalled echo pulse sequence employs a selective RF excitation pulse 300 which is applied to the subject in the presence of a $G_z$ slab select gradient pulse 301 to produce transverse magnetization in a selected slab. To compensate the resulting NMR signal 303 for the phase shifts caused by the slab select gradient pulse 301 and to desensitize the NMR signal 303 to velocity along the z-axis, a negative $G_z$ gradient pulse 304 followed by a positive $G_z$ gradient pulse 305 are produced by the $G_z$ gradient coils as taught in U.S. Pat. No. 4,731,583. The gradient pulse 304 has multiple amplitudes and it also provides phase encoding along the z axis direction. While the pulses 304 and 305 compensate for velocity along the z-axis, more complex gradient waveforms are also well known to those skilled in the art for compensating acceleration and even higher orders of motion.

To position encode the NMR signal 303 a phase encoding $G_y$ gradient pulse 306 is applied to the subject shortly after the application of the RF excitation pulse 300. As is well known in the art, a complete scan is comprised of a series of these pulse sequences in which the value of the $G_y$ phase encoding pulse is stepped through a series of, for example, 256 discrete phase encoding values to localize the position of the spins producing the NMR signal along the y-axis. Position along the x-axis is located by a $G_x$ gradient pulse 307 which is produced as the NMR gradient echo signal 303 is acquired to frequency encode the NMR signal 303. To produce the gradient echo 303 and to desensitize it to velocity along the x direction, gradient pulses 308 and 309 precede the gradient pulse 307 as taught in U.S. Pat. No. 4,731,583.

The NMR signal 303 is acquired by the system transceiver 122 and digitized into a row of $N_x$ (e.g. 256) complex numbers which are stored in memory. For each combination of the ($G_y$, $G_z$) phase encoding gradients an NMR signal 303 is produced, acquired, digitized and stored in a separate row of $N_x$ (e.g. 256) complex numbers. At the completion of the scan, therefore, a three-dimensional ($N_x \times N_y \times N_z$) array of k-space data is stored, where $N_y$ is the number of phase encoding steps along the y direction and $N_z$ is the number of phase encoding steps along the z direction. This array of k-space data may be used to reconstruct an image as described above.

It should be apparent to those skilled in the art that many other NMR imaging pulse sequences may be used. The imaging pulse sequence of FIG. 2 is preferred for cardiac imaging which is the preferred application of the present invention. As will now be described, navigator echo signals are also acquired during the image data acquisition to measure the displacement of subject motion during the scan.

In one embodiment of the invention a conventional navigator pulse sequence is used to measure the location of the patient's diaphragm during each cardiac cycle. This navigator pulse sequence excites a column of spins located at the right side of the abdomen, and transecting the diaphragm near the dome of the liver using a two-dimensional RF excitation pulse. An NMR signal is acquired in the presence of a readout gradient ($G_z$ in the preferred embodiment) directed along the lengthwise dimension of the excited column, and $N_{echo}$ (e.g. 256) samples of the NMR navigator signal are Fourier transformed by the array processor 161. The two-dimensional excitation rf pulse is, for example, a 30 mm diameter excitation which produces a 90° flip angle, although other diameters may also be excited. As described, for example, in U.S. Pat. No. 4,812,760, such two-dimensional RF pulses are produced in the presence of two gradient fields ($G_x$ and $G_y$ in the preferred embodiment) and the receiver low pass filter is set for a field of view (e.g. 260 mm) along the excited column (z axis). The NMR signal is sampled at $N_{echo}$ points during a period of, for example, 4 msec. sample period. A reference navigator echo is acquired prior to the acquisition of image data. The reference navigator echo is usually acquired at the end of expiration because the respiratory motion is more stable and reproducible at this position. The displacement between the current diaphragm position and the reference diaphragm position can be measured using the auto-correlation and least mean-squares algorithms as described by Y. Wang et al, "Algorithms for Extracting Motion Information From Navigator Echoes", *Magn. Reson. Med.*, 36:117–123, 1996. The diaphragm position can also be measured by using the linear phase shift algorithm disclosed in U.S. patent application Ser. No. 08/980,192 filed Nov. 26, 1997 by Thomas Kwok-Fah Foo and Kevin F. King.

Figure 3:
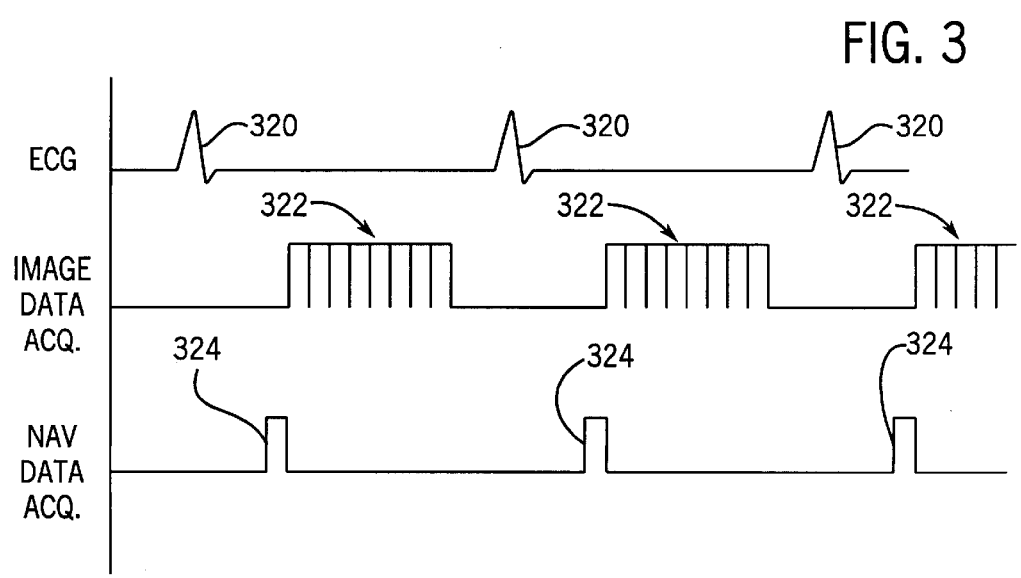
FIG. 3 is a graphic representation of a cardiac gated MRI scan in which a navigator pulse sequence is employed for respiratory gating according to the present invention.

This conventional navigator pulse sequence is used in a cardiac gated scan as depicted in FIG. 3. The QRS complex 320 of the ECG signal indicates the start of each R-R interval, during which segments 322 of NMR image data are acquired using the imaging pulse sequence of FIG. 2. As is well known in the art, each segment 322 samples a plurality of lines in k-space from one slab through the patient's heart and the acquisitions continue until enough image data has been acquired to reconstruct one or more images.

Figure 4:
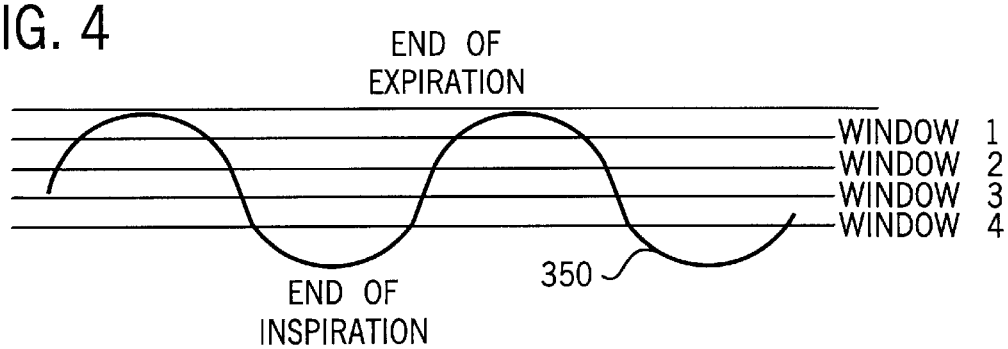
FIG. 4 is a graphic representation of a respiratory signal which indicates subject motion as a function of patient respiration.

The navigator pulse sequence is performed at each cardiac cycle to measure the location of the patient's diaphragm just prior to each segment 322 acquisition as indicated at 324. The navigator NMR signals provide an indication of diaphragm position just prior to each acquisition of image data during the cardiac gated MRI scan. As shown in FIG. 4, this diaphragm position information provides a respiration signal 350 which cycles between one value at the end of patient expiration and another value at the end of patient inspiration. As will now be described in more detail, the respiration signal 350 provided by the interleaved navigator pulse sequences 324 is used to gate image data acquisition from a plurality of 3D slaps.

Figure 5:
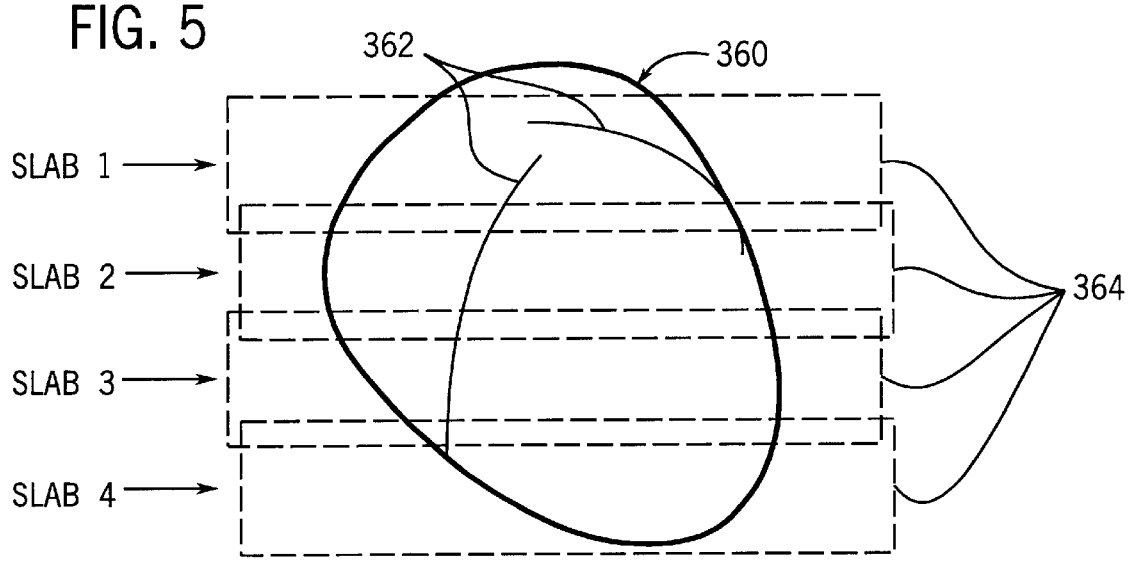
FIG. 5 is a pictorial representation of a patient's heart illustrating how the 3D volume is scanned in four separate slabs.

Referring particularly to FIG. 5, a scout MRI scan is performed to acquire a cross-sectional image of the patients heart indicated at 360. The coronary arteries 362 are at the surface of the heart. The 3D volume of interest is defined by the operator using interactive tools at the console 100 which enable a set of 3D slabs 364 to be positioned on the scout image. In the example illustrated in FIG. 5, four overlapping slabs 14 are specified by the operator and entered along with other scan parameters that prescribe the 3D cardiac gated MRI scan to be performed. In addition, the respiration signal 350 which is also acquired during the scout scan is displayed on the console 100 and the operator establishes respiratory gating windows. In the example illustrated in FIG. 4, four separate gating windows 1–4 are established and assigned to the four corresponding slabs 1–4. Each of the slabs is associated with a respiratory gating window. One of the preferred correspondences between the respiratory windows and the slabs is: Window 1 corresponds to Slab 1; Window 2 corresponds to Slab 2; Window 3 corresponds to Slab 3; and Window 4 corresponds to Slab 4. Another preferred correspondence between the respiratory windows and the slabs is: Window 1 corresponds to Slab 4; Window 2 corresponds to Slab 3; Window 3 corresponds to Slab 2; and Window 4 corresponds to Slab 1.

After the scout scan has been performed and the respiration gating windows have been defined and assigned to corresponding prescribed slabs, the scan is commenced. Referring to FIG. 3, during each cardiac cycle the navigator pulse sequence 324 is performed and the value of the respiration signal is calculated. If the measured respiratory position is within one of the defined respiration gating windows, image data segments 322 are acquired for the corresponding prescribed slab assigned to that window. If the respiration signal is not within any defined respiration gating window, no image data is acquired during that cardiac cycle.

The scan continues until 3D image data sets have been acquired for all of the prescribed slabs. Since four separate respiratory gating windows are used, however, the scan for all the slabs will require much less time, since image data may be acquired over a much larger portion of the respiratory cycle. Ideally, the size of the respiratory gating windows are set such that the acquisition of each slab will be completed at substantially the same time. To accomplish this the respiratory gating windows may be dynamically changed. These slabs can either be placed in the axial direction or any other orthogonal or oblique orientation.

After the slab data sets have been acquired, they are concatenated to form a single 3D data set of the entire region of interest. This can be done in a number of ways, but in every case the relative position of each acquired slab must be adjusted to account for the movement that occurs between the different respiration gating windows.

One method for concatenating the separate slabs is to manually register each slab. The first step is to reconstruct a 3D slab image from each 3D slab k-space data set by performing a 3D fast Fourier transformation as described above. The separate reconstructed slab images may then be displayed on the console 100 and manually moved into registration with each other using a track ball on the control panel 102. This registration is possible because the slabs 364 overlap as shown in FIG. 5 and contain a portion of the same anatomy depicted in each of the adjacent slabs. It should be apparent that this registration step can also be performed automatically using well known image registration methods.

Another method for concatenating the separate slabs is to shift their positions by measured amounts. For each window 14 shown in FIG. 4 there is a corresponding location in space of the patient's heart depicted in FIG. 5. That is, the heart moves in a cyclic manner as a result of respiration. During the scout scan the location of a reference point in the heart may be measured as a function of the respiration signal 350. A reference position is selected and the shift of this reference point away from the reference positions at the center of each respiration gating window is calculated. During concatenation, each slab is shifted in location by the amount corresponding to the shift of its respiratory gating window. Each slab is thus brought into registration with respect to the reference position.

These imaging slabs are prescribed and acquired at different locations with different orientations. For example, one of the slabs can be placed to acquire the image of right coronary artery (RCA) and one of the other slabs can be placed to acquire the image of left anterior descending artery. In this situation, no slab overlapping is needed and these slabs can be displayed separately.

What is claimed is:

1. A method for acquiring a three-dimensional image of a subject with an MRI system, the steps comprising:
   a) establishing a plurality of respiration gating windows;
   b) establishing a plurality of slabs by dividing a three-dimensional region of interest containing the subject into a plurality of three-dimensional slabs, one associated with each of the plurality of respiration gating windows;
   c) detecting the patients respiratory position and determining whether this detected respiratory position is within each of the plurality of respiration gating windows;
   d) acquiring NMR data from the associated three-dimensional slab with the MRI system when the detected respiratory position is within a respiration gating window; and
   e) repeating steps c) and d) until sufficient NMR data has been acquired for each slab to reconstruct an image.

2. The method as recited in claim 1 in which step c) includes:
   i) performing a navigator pulse sequence with the MRI system to produce a respiration signal; and
   ii) determining if the respiration signal is within a range of values for one of said respiration gating windows.

3. The method as recited in claim 1 in which the subject is the coronary arteries and the method includes:
   f) producing a cardiac gating signal which indicates phase of the patient's heart during each cardiac cycle; and
   step d) is performed at selected heart phases indicated by the cardiac gating signal.

4. The method as recited in claim 3 in which step c) includes:
   i) performing a navigator pulse sequence with the MRI system during each cardiac cycle to produce a respiration signal; and
   ii) determining if the respiration signal is within a range of values for one of said respiration gating windows.

5. The method as recited in claim 1 in which step b) includes:
   i) performing a scout scan with the MRI system to acquire NMR data from the patient;
   ii) reconstructing an image of the subject from the acquired NMR data;
   iii) designating the plurality of three-dimensional slabs on the image; and
   iv) defining a pulse sequence for acquiring NMR data from each of the designated three-dimensional slabs.

6. The method as recited in claim 1 in which the plurality of slabs established in step b) are oriented at a plurality of different angles.

7. An MRI system for producing a three-dimensional image of subject anatomy in a patient, the combination comprising:
   means for detecting each of a plurality of respiratory gating windows that indicate respective ranges of respiratory movement of the patient;
   a pulse generator for directing the MRI system to perform pulse sequences which acquire NMR data from a plurality of respective three-dimensional slabs in the subject anatomy, the pulse generator being operable when each of the respiratory gating windows is detected to acquire NMR data from the corresponding one of the plurality of three-dimensional slabs; and
   means for concatenating the NMR data acquired or each three-dimensional slab and reconstructing a three-dimensional image of the subject anatomy.

8. The MRI system as recited in claim 7 in which the subject anatomy is the patients heart and the MRI system includes:
   cardiac gating means for detecting the patient's heart beat and triggering the pulse generator to perform said pulse sequences at predetermined phases of the cardiac cycle.

9. The MRI system as recited in claim 7 in which the means for detecting the respiratory gating windows includes means for directing the pulse generator to periodically perform a navigator pulse sequence to acquire NMR data from the patient which indicates movement caused by patient respiration.

10. The MRI system of claim 7 in which the three-dimensional slabs from which the NMR data is acquired are oriented at a plurality of different angles.

* * * * *